United States Patent
Na et al.

(10) Patent No.: US 8,558,389 B2
(45) Date of Patent: Oct. 15, 2013

(54) SEMICONDUCTOR DEVICE AND METHOD OF FORMING GUARD RING AROUND CONDUCTIVE TSV THROUGH SEMICONDUCTOR WAFER

(75) Inventors: Duk Ju Na, Singapore (SG); Lai Yee Chia, Singapore (SG); Chang Beom Yong, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 81 days.

(21) Appl. No.: 13/315,033

(22) Filed: Dec. 8, 2011

(65) Prior Publication Data
US 2013/0147055 A1 Jun. 13, 2013

(51) Int. Cl.
*H01L 23/48* (2006.01)
*H01L 23/52* (2006.01)
*H01L 29/40* (2006.01)

(52) U.S. Cl.
USPC ........................................ 257/774

(58) Field of Classification Search
USPC ......... 257/686, 127, 170, 621, 41, 81, 82, 91, 257/99, 177–182, 276, 457, 459, 502, 503, 257/573, 584, 602, 664–677, 688–700, 257/764–786, 737, 738, 685, 723, 257/E25.031–E25.032, 409, 678–733, 257/787–796, E23.001–E23.194; 438/109, 438/83, 98, 100, 101, 111, 112, 123, 124, 438/411, 412, 461, 584, 597–688, 92, 438/167–185, 534, 570–583
See application file for complete search history.

(56) References Cited

U.S. PATENT DOCUMENTS

| | | | |
|---|---|---|---|
| 5,646,067 A | 7/1997 | Gaul | |
| 6,734,084 B1 | 5/2004 | Nemoto et al. | |
| 6,875,672 B2 | 4/2005 | Nemoto et al. | |
| 7,214,615 B2 | 5/2007 | Miyazawa | |
| 7,525,186 B2 * | 4/2009 | Kim et al. | 257/686 |
| 7,531,890 B2 * | 5/2009 | Kim | 257/621 |
| 7,683,458 B2 | 3/2010 | Akram et al. | |
| 7,833,895 B2 | 11/2010 | Bonifield et al. | |
| 2008/0003718 A1 | 1/2008 | Estepa et al. | |
| 2008/0153208 A1 | 6/2008 | Matsunami | |
| 2008/0237806 A1 * | 10/2008 | Uchiyama | 257/621 |
| 2009/0155956 A1 * | 6/2009 | Pohl et al. | 438/109 |

* cited by examiner

*Primary Examiner* — Dao H Nguyen
*Assistant Examiner* — Tram H Nguyen
(74) *Attorney, Agent, or Firm* — Robert D. Atkins; Patent Law Group: Atkins & Associates, P.C.

(57) ABSTRACT

A semiconductor device has a plurality of conductive vias formed into a semiconductor wafer. An insulating lining is formed around the conductive vias and a conductive layer is formed over the insulating lining. A portion of the semiconductor wafer is removed so the conductive vias extend above a surface of the semiconductor wafer. A first insulating layer is formed over the surface of the semiconductor wafer and conductive vias. A first portion of the first insulating layer is removed and a second portion of the first insulating layer remains as guard rings around the conductive vias. A conductive layer is formed over the conductive vias. A second insulating layer is formed over the surface of the semiconductor wafer, guard rings, and conductive vias. A portion of the second insulating layer is removed to expose the conductive vias and a portion of the guard rings.

20 Claims, 12 Drawing Sheets

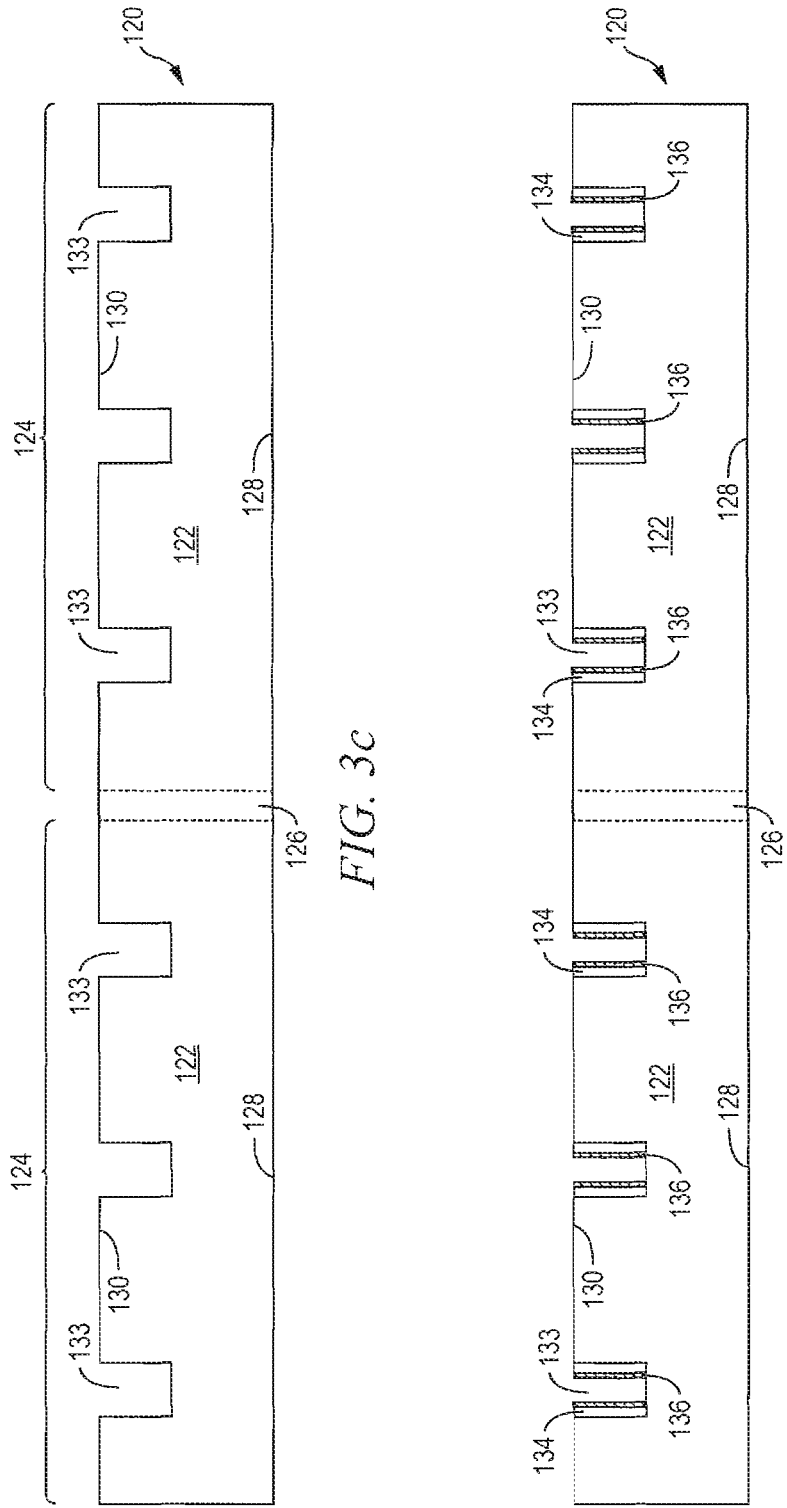

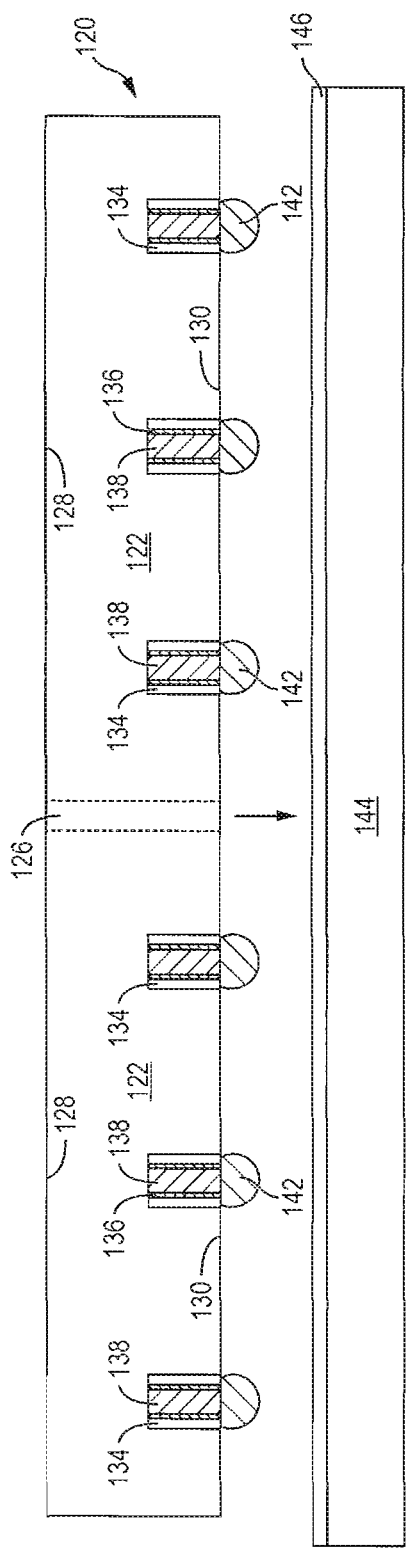
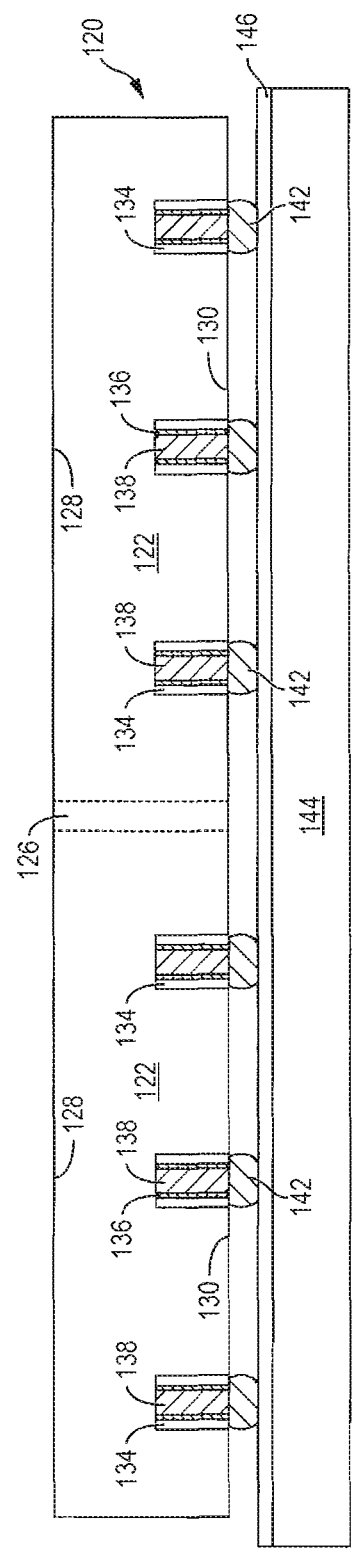
FIG. 3g
FIG. 3h

SEMICONDUCTOR DEVICE AND METHOD OF FORMING GUARD RING AROUND CONDUCTIVE TSV THROUGH SEMICONDUCTOR WAFER

FIELD OF THE INVENTION

The present invention relates in general to semiconductor devices and, more particularly, to a semiconductor device and method of forming guard rings around conductive TSV through a semiconductor wafer to provide sufficient overlay margin.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer may contain conductive through silicon vias (TSV). A plurality of vias is formed through the semiconductor wafer. The vias are filled with conductive material to form the conductive TSV. A portion of the back surface of the semiconductor wafer is removed by chemical mechanical polishing (CMP) to expose a portion of the side surface of the conductive TSV. CMP is an expensive manufacturing process. Alternatively, a portion of the back surface of the semiconductor wafer is removed by a photolithographic etching process with a 1× stepper to expose a portion of the side surface of the conductive TSV. The 1× stepper typically cannot provide sufficient overlay margin for the photolithographic and etching process.

SUMMARY OF THE INVENTION

A need exists for a cost effective process of extending a conductive TSV above a surface of a semiconductor wafer while providing sufficient overlay margin. Accordingly, in one embodiment, the present invention is a method of making a semiconductor device comprising the steps of providing a semiconductor wafer, forming a plurality of conductive vias into the semiconductor wafer, removing a portion of the semiconductor wafer so the conductive vias extend above a surface of the semiconductor wafer, forming a first insulating layer over the surface of the semiconductor wafer and conductive vias, removing a first portion of the first insulating layer while leaving a second portion of the first insulating layer as guard rings around the conductive vias, forming a second insulating layer over the surface of the semiconductor wafer, guard rings, and conductive vias, and removing a portion of the second insulating layer to expose the conductive vias.

In another embodiment, the present invention is a method of making a semiconductor device comprising the steps of providing a semiconductor die, forming a conductive via through the semiconductor die with a portion of the conductive via extending above a surface of the semiconductor wafer, forming a first insulating layer over the surface of the semiconductor wafer and conductive via, and removing a first portion of the first insulating layer while leaving a second portion of the first insulating layer as a guard ring around the conductive via.

In another embodiment, the present invention is a method of making a semiconductor device comprising the steps of providing a semiconductor die, forming a conductive via through the semiconductor die with a portion of the conductive via extending above a surface of the semiconductor wafer, and forming a guard ring over the surface of the semiconductor wafer around the conductive via.

In another embodiment, the present invention is a semiconductor device comprising a semiconductor die and conductive via formed through the semiconductor die with a portion of the conductive via extending above a surface of the semiconductor wafer. A guard ring is formed over the surface of the semiconductor wafer around the conductive via.

DETAILED DESCRIPTION OF THE DRAWINGS

Figure 1:
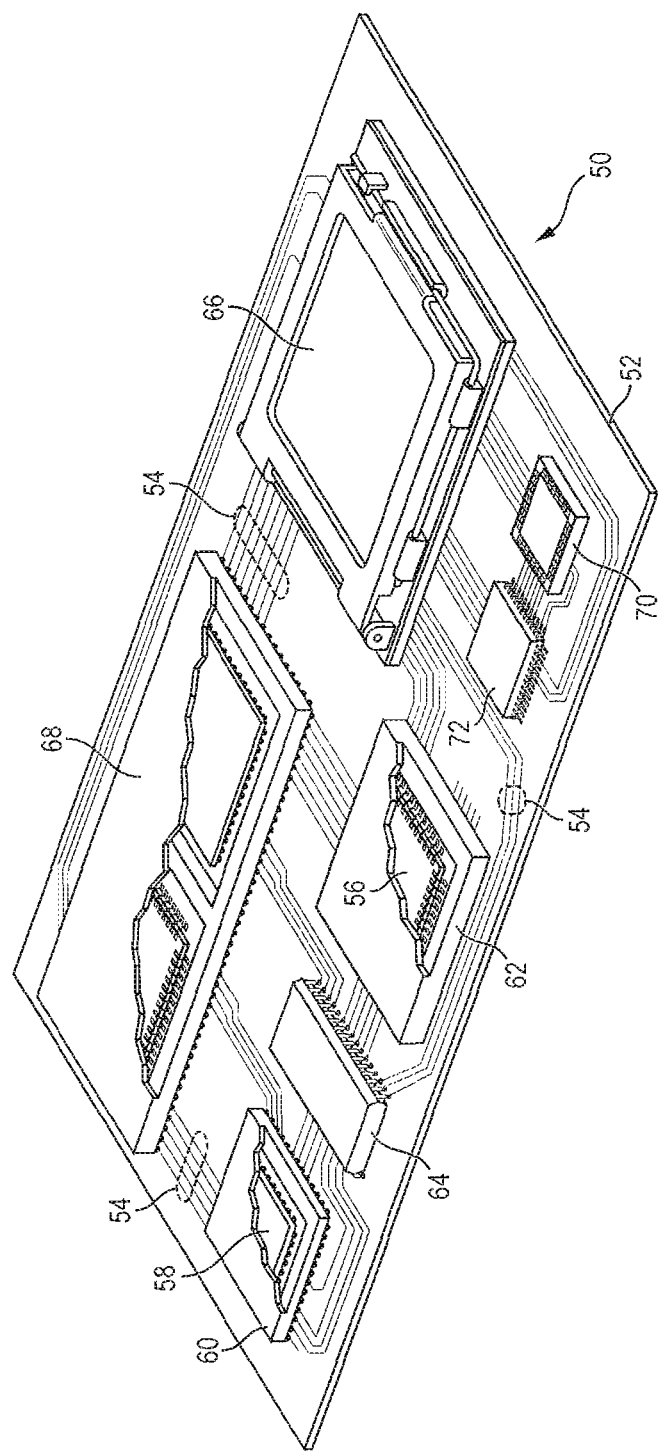
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
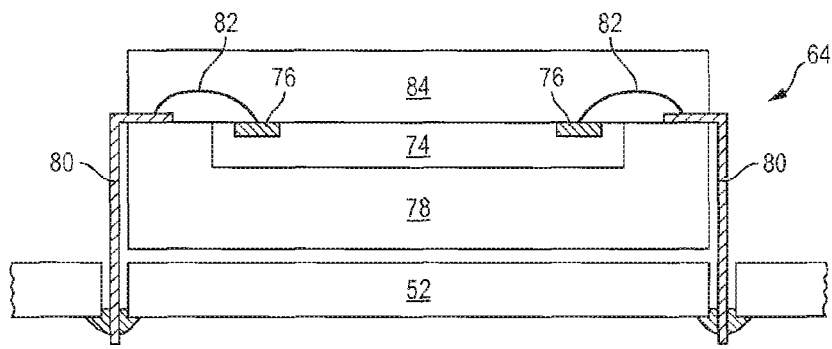
FIGS. 2a-2c illustrate further detail of the representative semiconductor packages mounted to the PCB.
Figure 2B:
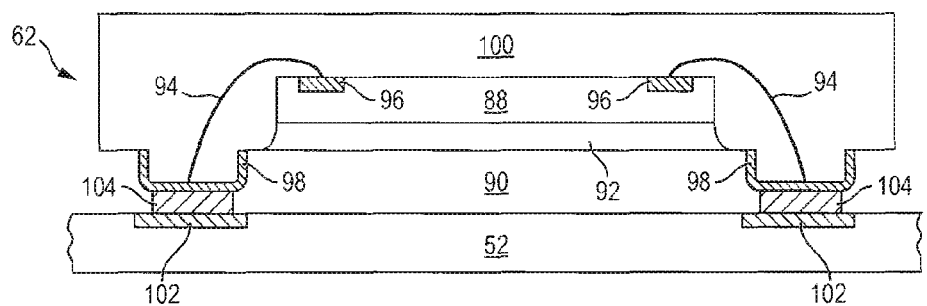
Figure 2C:
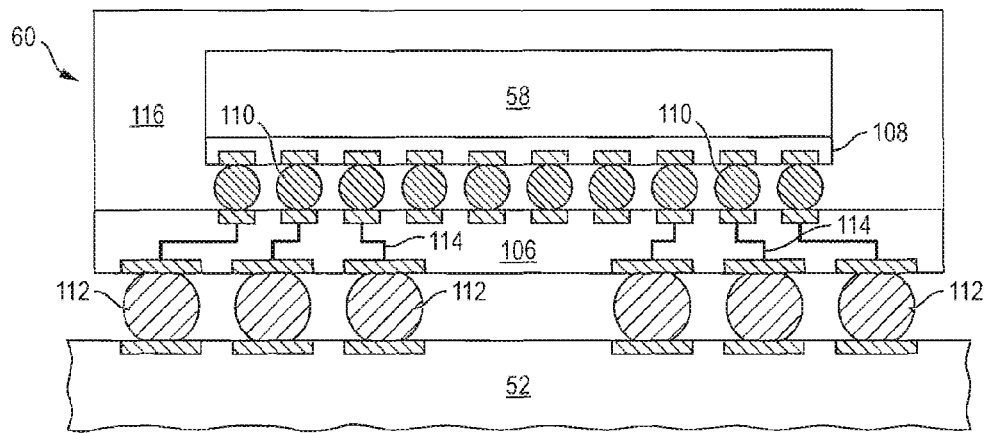

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
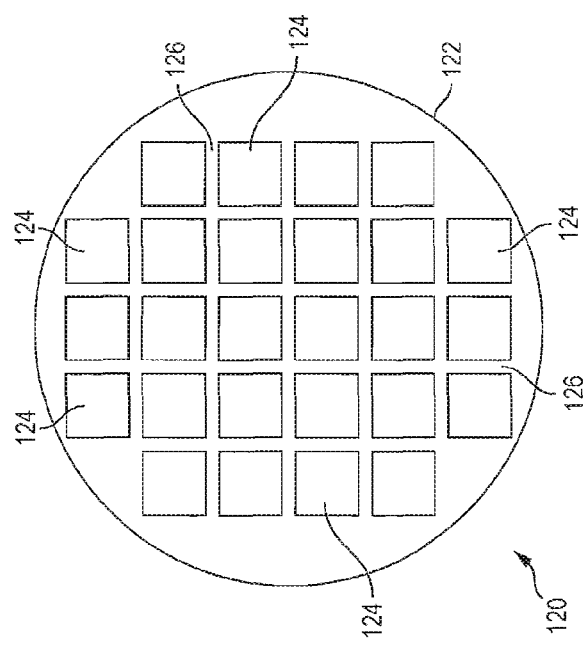
FIGS. 3a-3r illustrate a process of forming guard rings around conductive TSV through a semiconductor wafer.
Figure 3B:
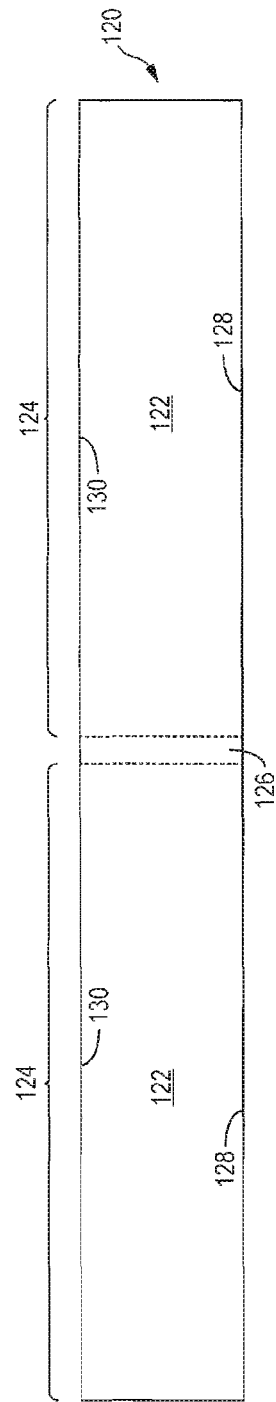
Figure 3E:
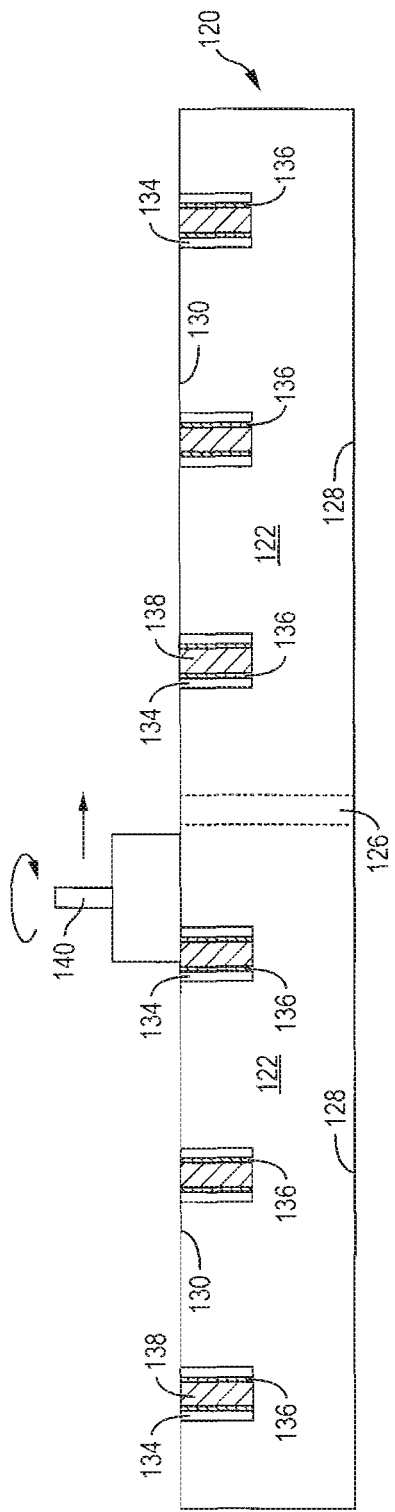
Figure 3F:
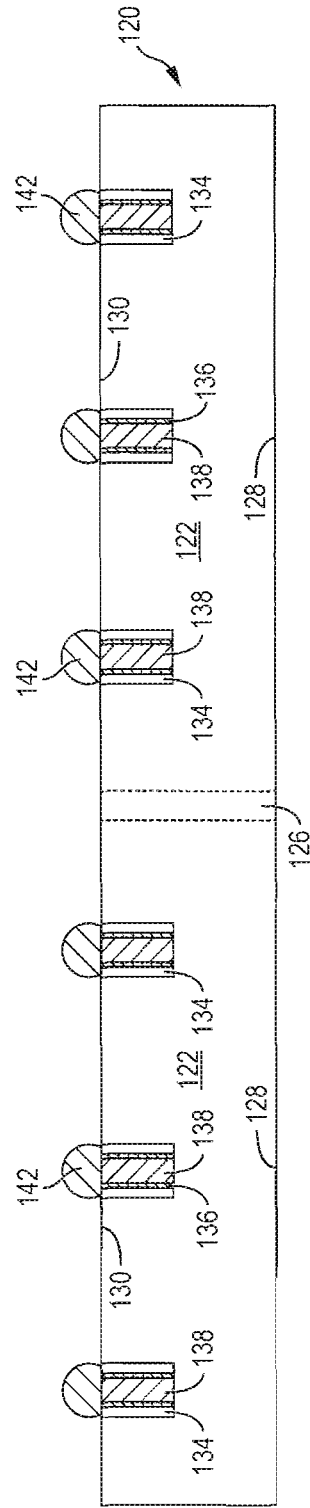
Figure 3I:
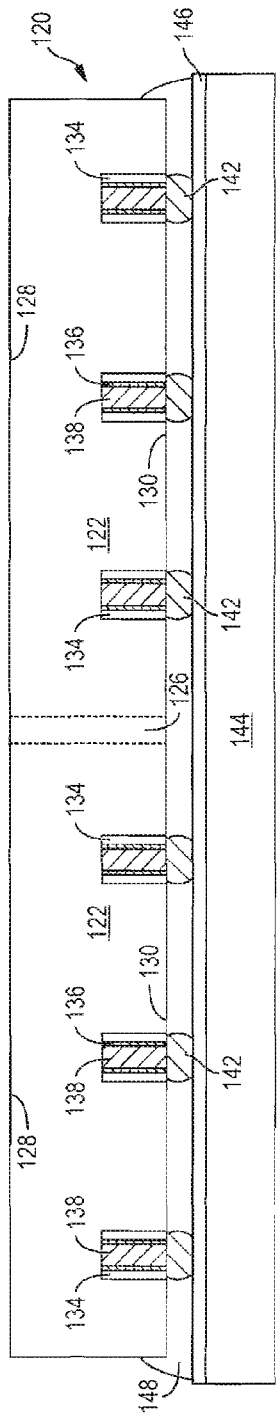
Figure 3J:
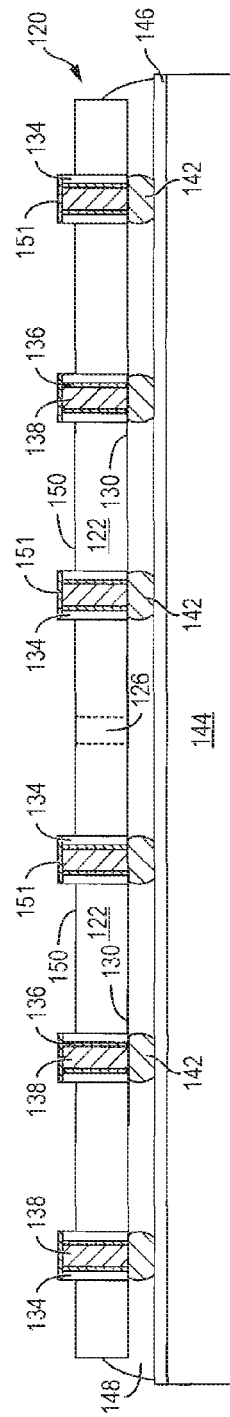
Figure 3K:
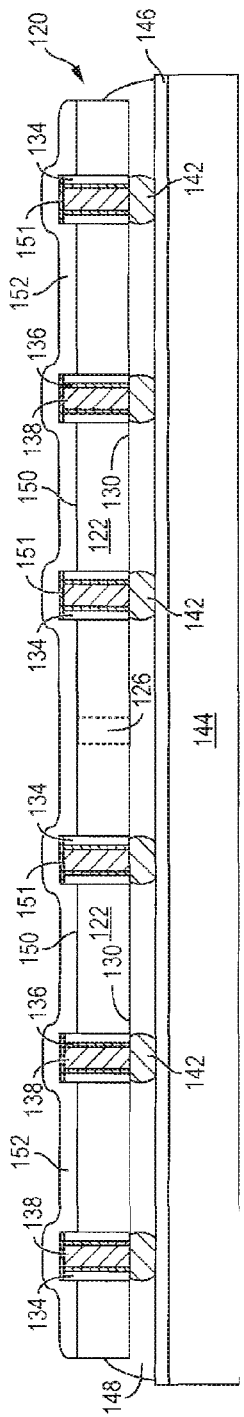
Figure 3L:
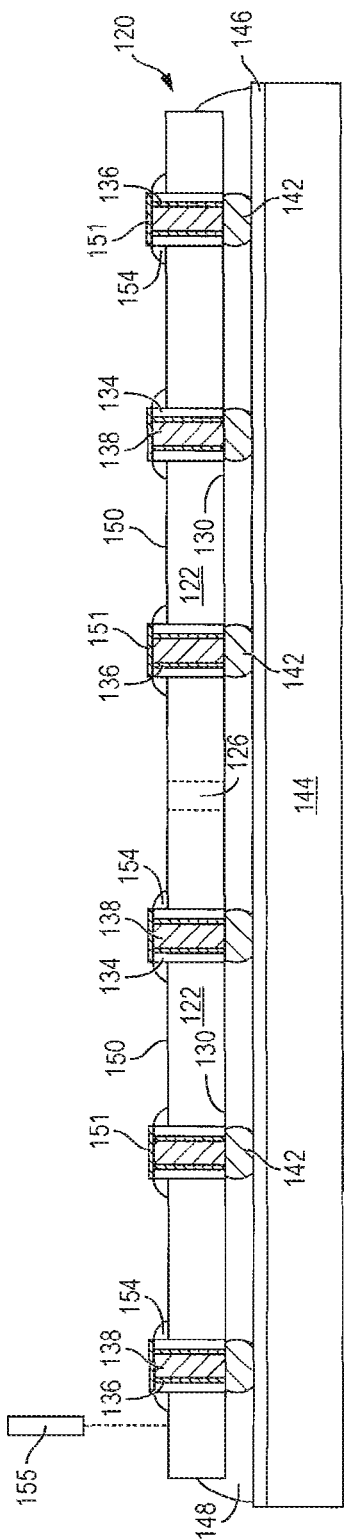
Figure 3M:
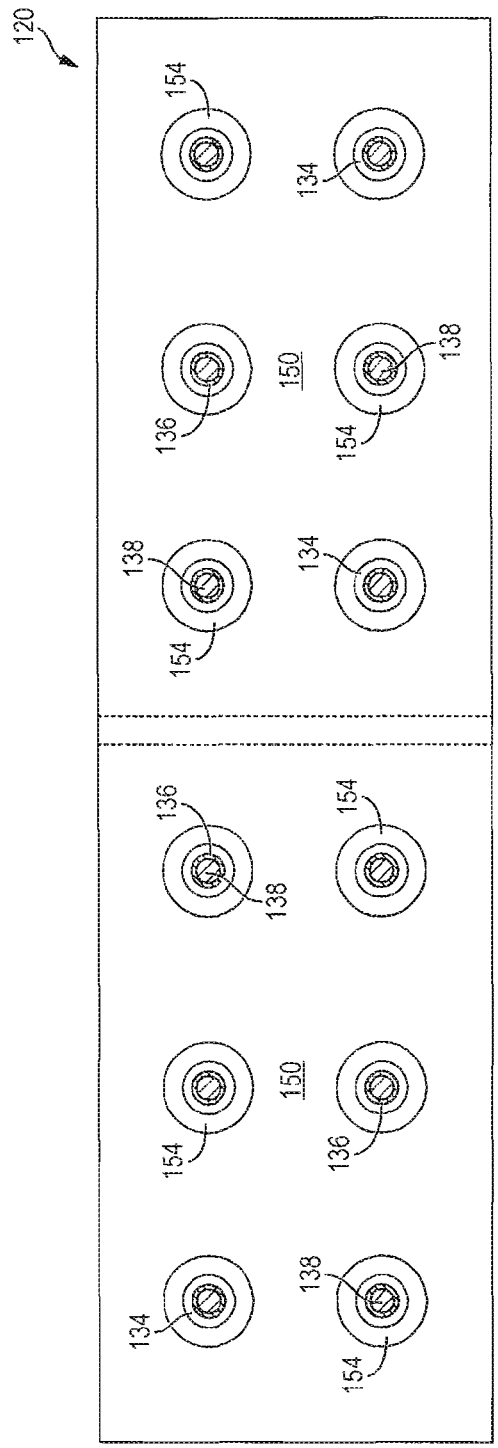
Figure 3N:
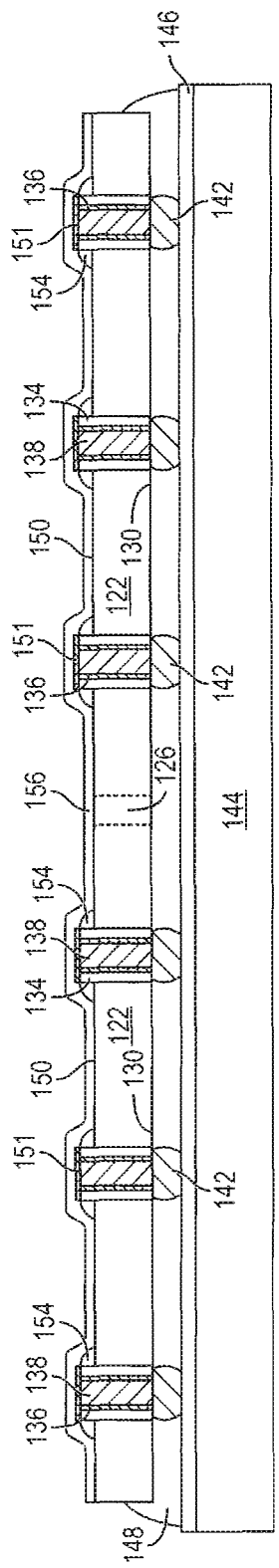
Figure 3O:
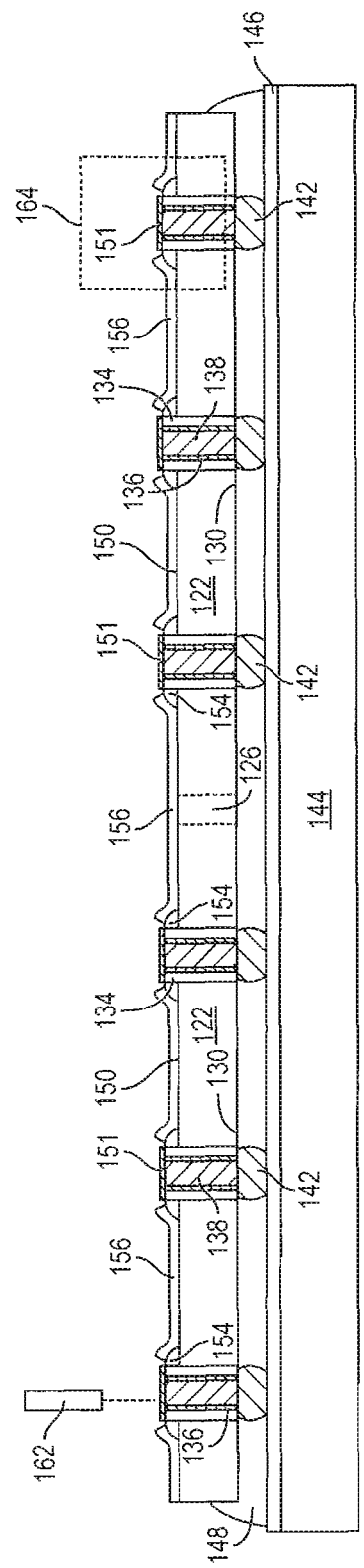
Figure 3P:
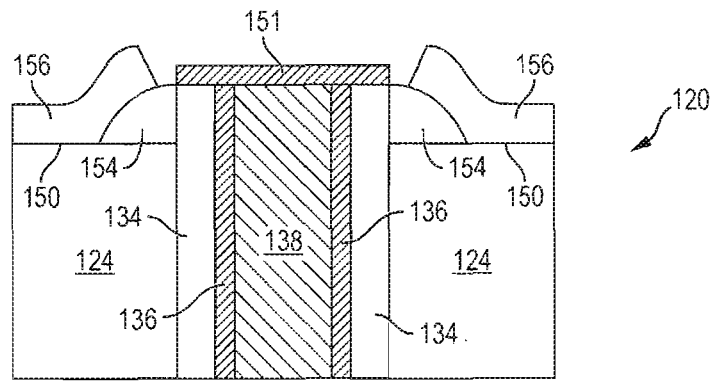
Figure 3Q:
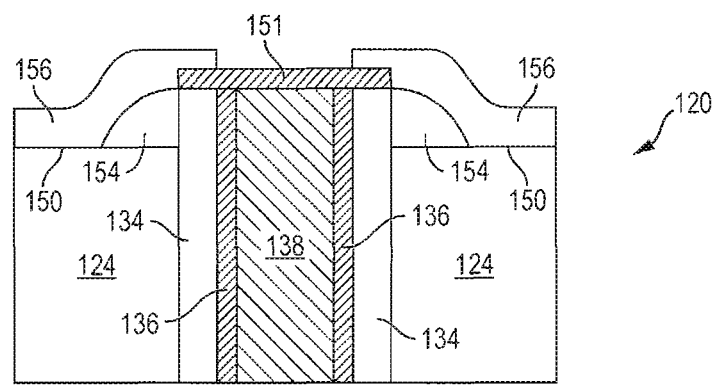
Figure 3R:
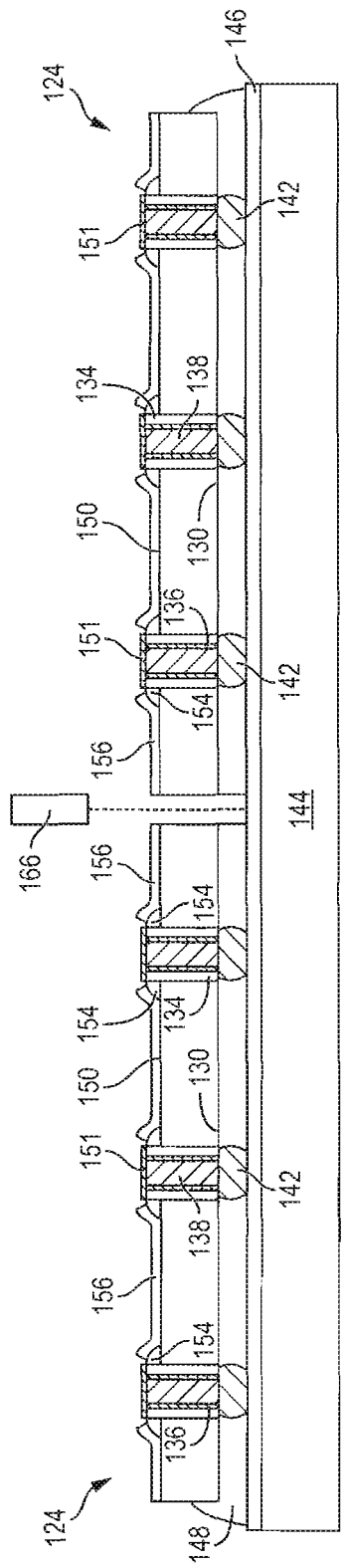

FIGS. 3a-3r illustrate, in relation to FIGS. 1 and 2a-2c, a process of forming guard rings around conductive TSV through a semiconductor wafer to provide sufficient overlay margin. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

In FIG. 3c, a plurality of blind vias 133 is formed into active surface 130 and partially but not completely through semiconductor wafer 120 using mechanical drilling, laser drilling, or deep reactive ion etching (DRIE).

In FIG. 3d, an insulating or dielectric layer 134 is formed over sidewalls of vias 133 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material.

An electrically conductive layer 136 is formed over insulating layer 134 within vias 133 using a patterning and metal deposition process such as printing, PVD, CVD, sputtering, electrolytic plating, and electroless plating. Conductive layer 136 can be one or more layers of Ni, tantalum nitride (TaN), nickel vanadium (NiV), platinum (Pt), palladium (Pd), chromium copper (CrCu), or other suitable barrier material.

In FIG. 3e, blind vias 133 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive TSV 138 lined with insulating layer 134 and conductive layer 136 and embedded within semiconductor wafer 120. In one embodiment, conductive layer 136 operates as a barrier layer to inhibit diffusion of conductive TSV 138, e.g. Cu, into insulating layer 134 and base substrate material 122. Conductive TSV 138 are electrically connected to the circuits on active surface 130. A portion of active surface 130 of semiconductor die 124 is optionally removed by grinder 140 or CMP to planarize the surface and expose conductive TSV 138.

In FIG. 3f, an electrically conductive bump material is deposited over conductive TSV 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 138 using a suitable attachment or bonding process. In one embodiment, the bump material is reflowed by heating the material above its melting point to form spherical balls or bumps 142. In some applications, bumps 142 are reflowed a second time to improve electrical contact to conductive TSV 138. An optional under bump metallization (UBM) layer can be disposed between bumps 142 and conductive TSV 138. Bumps 142 can also be compression bonded to conductive TSV 138. Bumps 142 represent one type of interconnect structure that can be formed over conductive TSV 138. The interconnect structure can also use stud bump, micro bump, or other electrical interconnect.

FIG. 3g shows a temporary substrate or carrier 144 containing sacrificial base material such as silicon, polymer, beryllium oxide, glass, or other suitable low-cost, rigid material for structural support. An interface layer or double-sided tape 146 is formed over carrier 144 as a temporary adhesive bonding film, etch-stop layer, or thermal release layer. Semiconductor wafer 120 is inverted, positioned over, and mounted to interface layer 146 over carrier 144 with active surface 130 and bumps 142 oriented toward the carrier. FIG. 3h shows semiconductor wafer 120 mounted to interface layer 146 over carrier 144.

Semiconductor wafer 120 and carrier 144 are placed in a chase mold. A mold underfill (MUF) material 148 in a liquid state is injected into the chase mold between semiconductor wafer 120 and carrier 144. MUF material 148 can be an encapsulant, molding compound, or polymer composite material, such as epoxy resin with filler, epoxy acrylate with filler, or polymer with proper filler. MUF material 148 is cured. FIG. 3i shows MUF material 148 disposed between semiconductor wafer 120 and carrier 144.

In FIG. 3j, a portion of back surface 128 is removed by a combination of backgrinding, CMP, and/or etching processes to expose conductive TSV 138 above surface 150 of semiconductor wafer 120. Conductive TSV 138 remains lined with insulating layer 134 and conductive layer 136 and extending above surface 150 of semiconductor wafer 120.

An electrically conductive layer 151 is formed over insulating layer 134, conductive layer 136, and conductive TSV 138 using a patterning and metal deposition process such as printing, PVD, CVD, sputtering, electrolytic plating, and electroless plating. Conductive layer 151 can be one or more layers of titanium tungsten (TiW), titanium copper (TiCu), titanium tungsten copper (TiWCu), tantalum nitrogen copper (TaNCu), or other suitable material. In one embodiment, conductive layer 151 operates as a seed layer for electrical interconnect to external devices. Conductive layer 151 can be formed prior to etching surface 128 to extend conductive TSV 138 above surface 150.

In FIG. 3k, an insulating or dielectric layer 152 is conformally applied over surface 150 of semiconductor wafer 120, insulating layer 134, and conductive layer 151 using PVD, CVD, printing, spin coating, spray coating, sintering or thermal oxidation. The insulating layer 152 contains one or more layers of SiO2, Si3N4, SiON, Ta2O5, Al2O3, HfO2, PI, BCB, PBO, or other material having similar dielectric properties. The insulating layer 152 follows the contour of surface 150, insulating layer 134, and conductive layer 151.

In FIG. 3l, a portion of insulating layer 152 is removed by an etching process through a patterned photoresist layer to expose surface 150 of semiconductor wafer 120 and conductive TSV 138, while leaving a portion of insulating layer 152 around insulating layer 134, conductive layer 136, and conductive TSV 138 as guard rings 154. In another embodiment, a portion of insulating layer 152 is removed by laser direct ablation (LDA) using laser 155 to form guard rings 154 around insulating layer 134, conductive layer 136, and conductive TSV 138. FIG. 3m shows a plan view of insulating layer 152 as guard rings 154 around insulating layer 134, conductive layer 136, and conductive TSV 138. Guard rings 154 are formed around conductive TSV 138 for overlay margin during subsequent manufacturing process using photolithography.

In FIG. 3n, an insulating or passivation layer 156 is conformally applied over surface 150 of semiconductor wafer 120, guard rings 154, and conductive layer 151 using PVD, CVD, printing, spin coating, spray coating, sintering or thermal oxidation. The insulating layer 156 contains one or more layers of SiO2, Si3N4, SiON, Ta2O5, Al2O3, or other material having similar structural and insulating properties. The insulating layer 156 follows the contour of surface 150, guard rings 154, and conductive layer 151.

In FIG. 3o, a portion of insulating layer 156 is removed by an etching process through a patterned photoresist layer to expose conductive layer 151 and a portion of guard rings 154. In another embodiment, a portion of insulating layer 156 is removed by LDA using laser 162 to expose conductive layer 151 and a portion of guard rings 154. FIG. 3p shows further detail of insulating layer 156, conductive layer 151, and guard ring 154 in block 164 defined in FIG. 3o. FIG. 3q shows an embodiment with insulating layer 156 formed over surface 150 of semiconductor wafer 120 and guard rings 154, while exposing conductive layer 151.

In FIG. 3r, semiconductor wafer 120 is singulated through insulating layer 156, saw street 126, and MUF material 148 using a saw blade or laser cutting tool 166 into individual semiconductor die 124. Carrier 144 and interface layer 146 are removed by chemical etching, mechanical peeling, CMP, mechanical grinding, thermal bake, UV light, laser scanning, or wet stripping to expose bumps 142.

Figure 4:
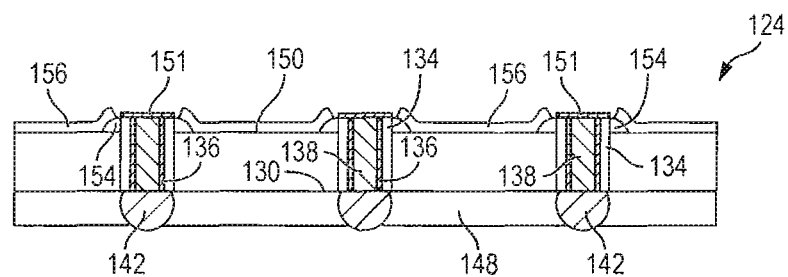
FIG. 4 illustrates a semiconductor die with guard rings around the conductive TSV.

FIG. 4 shows semiconductor die 124 after singulation. The circuits on active surface 130 of semiconductor die 124 are electrically connected through conductive TSV 138 to bumps 142. Guard rings 154 are formed around conductive TSV 138 for overlay margin during subsequent manufacturing process using photolithography.

Figure 5:
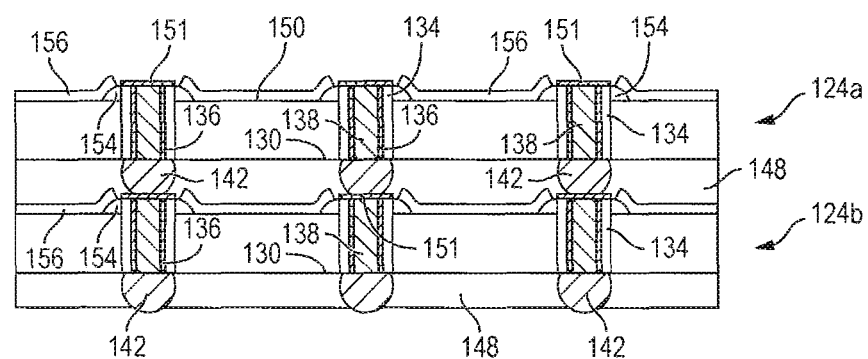
FIG. 5 illustrates two stacked semiconductor die with guard rings around the conductive TSV.

FIG. 5 shows two stacked semiconductor die 124 electrically connected through conductive TSV 138. The circuits on active surface 130 of semiconductor die 124a are electrically connected through conductive TSV 138 and bumps 142 to the circuits on active surface 130 of semiconductor die 124b.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer;
   forming a plurality of conductive vias into the semiconductor wafer;
   removing a portion of the semiconductor wafer so the conductive vias extend above a surface of the semiconductor wafer;
   forming a first insulating layer over the surface of the semiconductor wafer and conductive vias;
   removing a first portion of the first insulating layer while leaving a second portion of the first insulating layer as guard rings around the conductive vias;
   forming a second insulating layer over the surface of the semiconductor wafer, guard rings, and conductive vias; and
   removing a portion of the second insulating layer to expose the conductive vias.

2. The method of claim 1, wherein forming the plurality of conductive vias includes:
   forming a plurality of vias through the semiconductor wafer;
   forming a third insulating layer in the vias; and
   depositing a conductive material in the vias.

3. The method of claim 2, further including forming a conductive layer over the third insulating layer.

4. The method of claim 1, further including forming a conductive layer over the conductive vias.

5. The method of claim 1, further including removing the portion of the second insulating layer to expose the guard rings.

6. The method of claim 1, further including removing the first portion of the first insulating layer by laser direct ablation.

7. A method of making a semiconductor device, comprising:
   providing a semiconductor die;
   forming a conductive via through the semiconductor die with a portion of the conductive via extending above a surface of the semiconductor die;
   forming a first insulating layer over the surface of the semiconductor die and conductive via; and
   removing a first portion of the first insulating layer while leaving a second portion of the first insulating layer as a guard ring around the conductive via.

8. The method of claim 7, further including:
   forming a second insulating layer over the surface of the semiconductor die, guard ring, and conductive via; and
   removing a portion of the second insulating layer to expose the conductive via.

9. The method of claim 8, further including removing the portion of the second insulating layer to expose the guard ring.

10. The method of claim 8, further including removing the portion of the second insulating layer over the conductive via by laser direct ablation.

11. The method of claim 7, wherein forming the conductive via includes:
 forming a via through the semiconductor die;
 forming a second insulating layer in the via; and
 depositing a conductive material in the via.

12. The method of claim 11, further including forming a conductive layer over the second insulating layer.

13. The method of claim 7, further including forming a conductive layer over the conductive via.

14. A method of making a semiconductor device, comprising:
 providing a semiconductor die;
 forming a conductive via through the semiconductor die with a portion of the conductive via extending above a surface of the semiconductor die;
 forming a guard ring over the surface of the semiconductor die around the conductive via;
 forming a first insulating layer over the surface of the semiconductor die, guard ring, and conductive via; and
 removing a portion of the first insulating layer to expose the conductive via and guard ring.

15. The method of claim 14, wherein forming the guard ring includes:
 forming a second insulating layer over the surface of the semiconductor die and conductive via; and
 removing a first portion of the second insulating layer while leaving a second portion of the second insulating layer as the guard ring around the conductive via.

16. The method of claim 14, wherein forming the conductive via includes:
 forming a via through the semiconductor die;
 forming a second insulating layer in the via; and
 depositing a conductive material in the via.

17. The method of claim 14, further including forming a conductive layer over the conductive via.

18. A semiconductor device, comprising:
 a semiconductor die;
 a conductive via formed through the semiconductor die with a portion of the conductive via extending above a surface of the semiconductor die;
 a guard ring formed over the surface of the semiconductor die around the conductive via; and
 a first insulating layer formed over the surface of the semiconductor die and conductive via to expose the guard ring and conductive via.

19. The semiconductor device of claim 18, further including a second insulating layer formed around the conductive via.

20. The semiconductor device of claim 18, further including a conductive layer formed over the conductive via.

* * * * *